United States Patent
Ezura et al.

(10) Patent No.: US 9,428,840 B2
(45) Date of Patent: Aug. 30, 2016

(54) HIGH STRENGTH, HIGH HEAT RESISTANCE ELECTRODEPOSITED COPPER FOIL AND MANUFACTURING METHOD FOR SAME

(71) Applicant: FURUKAWA ELECTRIC CO., LTD., Tokyo (JP)

(72) Inventors: Takeshi Ezura, Tokyo (JP); Akitoshi Suzuki, Tokyo (JP); Kensaku Shinozaki, Tokyo (JP); Hirokazu Sasaki, Tokyo (JP); Satoshi Yamazaki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 67 days.

(21) Appl. No.: 14/353,081

(22) PCT Filed: Oct. 30, 2012

(86) PCT No.: PCT/JP2012/078078
§ 371 (c)(1),
(2) Date: Apr. 21, 2014

(87) PCT Pub. No.: WO2013/065699
PCT Pub. Date: May 10, 2013

(65) Prior Publication Data
US 2014/0291156 A1    Oct. 2, 2014

(30) Foreign Application Priority Data
Oct. 31, 2011    (JP) .................... 2011-238485

(51) Int. Cl.
| | | |
|---|---|---|
| C25D 3/58 | (2006.01) |
| C25D 7/06 | (2006.01) |
| C25D 1/04 | (2006.01) |
| H05K 1/09 | (2006.01) |
| C25D 3/38 | (2006.01) |
| H05K 1/03 | (2006.01) |
| H05K 3/02 | (2006.01) |

(52) U.S. Cl.
CPC .............. *C25D 7/0614* (2013.01); *C25D 1/04* (2013.01); *C25D 3/38* (2013.01); *C25D 3/58* (2013.01); *H05K 1/09* (2013.01); *H05K 1/0393* (2013.01); *H05K 3/022* (2013.01)

(58) Field of Classification Search
USPC ...... 205/76, 77, 78, 102, 105, 238, 291, 295
See application file for complete search history.

(56) References Cited

U.S. PATENT DOCUMENTS

| | | | | |
|---|---|---|---|---|
| 5,181,770 A | * | 1/1993 | Brock ...................... | C25D 1/04 205/77 |
| 5,421,985 A | * | 6/1995 | Clouser ................... | C25D 1/04 205/296 |
| 5,431,803 A | | 7/1995 | DiFranco et al. | |
| 5,863,666 A | * | 1/1999 | Merchant ................ | C25D 3/38 205/148 |
| 5,958,209 A | * | 9/1999 | Sakai ...................... | C25D 1/04 205/241 |
| 2002/0053517 A1 | | 5/2002 | Endo et al. | |
| 2006/0210823 A1 | | 9/2006 | Sano et al. | |
| 2011/0171491 A1 | | 7/2011 | Suzuki et al. | |

FOREIGN PATENT DOCUMENTS

| | | |
|---|---|---|
| CN | 1348326 A | 5/2002 |
| CN | 102124148 A | 7/2011 |
| EP | 1 079 005 A1 | 2/2001 |
| JP | 7-278867 A | 10/1995 |
| JP | 9-67693 A | 3/1997 |
| JP | 11-256389 A | 9/1999 |
| JP | 2000-17476 A | 1/2000 |
| JP | 3238276 B2 | 12/2001 |
| JP | 3270637 B2 | 4/2002 |
| JP | 2007-501330 A | 1/2007 |
| JP | 3943214 B2 | 7/2007 |
| JP | 4120806 B2 | 7/2008 |
| JP | 4273309 B2 | 6/2009 |
| JP | 2009-221592 A | 10/2009 |
| WO | WO 2004/107833 A1 | 12/2004 |

OTHER PUBLICATIONS

International Search Report, mailed Jan. 22, 2013, issued in PCT/JP2012/078078.
Chinese Office Action and Search Report for Chinese Application No. 201280047229.X, dated Oct. 28, 2015, with an English translation.

* cited by examiner

*Primary Examiner* — Archene Turner
(74) *Attorney, Agent, or Firm* — Birch, Stewart, Kolasch & Birch, LLP

(57) ABSTRACT

Task: To provide an electrodeposited copper alloy foil with large mechanical strength under normal conditions, and that does not easily degrade due to heat when heated to about 300° C.
Resolution Means: An electrodeposited copper alloy foil that includes a metal that exists as an oxide in a solution at pH4 or less or an oxide of the metal, and a method of manufacturing same.

28 Claims, No Drawings

HIGH STRENGTH, HIGH HEAT RESISTANCE ELECTRODEPOSITED COPPER FOIL AND MANUFACTURING METHOD FOR SAME

TECHNICAL FIELD

The present invention relates to an electrodeposited copper alloy foil, for example an electrodeposited copper alloy foil made from a copper (Cu)-tungsten (W) copper alloy, and a method of manufacturing same.

BACKGROUND ART

Conventionally electrodeposited copper foil is used in various fields such as rigid printed circuit boards, flexible printed circuit boards, and electromagnetic field shielding materials.

Within these fields, in the fields of flexible printed wiring board (hereafter referred to as "FPC") laminated with polyimide film, there is a demand for higher strength copper foil for hard disk drive (hereafter referred to as HDD) suspension materials, and for tape automated bonding (hereafter referred to as "TAB") materials.

In the case of suspensions in HDDs, with the progressive increase in capacity the wire type suspensions that were conventionally used have been mostly replaced by the wiring integrated type suspension which has high stability of suspension force and positional accuracy for the disk, which is the recording medium.

This wiring integrated type suspension includes three types: (1) the type referred to as the flex suspension assembly (FSA) method in which a flexible printed board is processed and bonded using adhesive, (2) the type referred to as the circuit integrated suspension (CIS) method in which amic acid, a precursor of polyimide resin, is processed to a shape, then it is converted to polyimide and a plating process is performed on the polyimide obtained to form the wiring, and (3) the type referred to as the trace suspension assembly (TSA) method in which a 3 layer laminate structure of stainless steel foil, polyimide resin, and copper foil is formed into predetermined shape by etching.

Of these, the TSA method suspension can easily form flying leads by laminating copper foil onto the stainless steel foil which has high strength, and because it has a high degree of freedom of shape processing, is comparatively low cost, and has good dimensional accuracy, it is widely used.

In suspensions formed by the TSA method the laminate is manufactured using as materials stainless steel foil with a thickness of about 12 to 30 μm, a polyimide layer with a thickness of about 5 to 20 μm, and copper foil with a thickness of about 7 to 14 μm.

In the manufacture of the laminate, a liquid that includes a polyimide resin precursor is applied to the stainless steel foil, which is the substrate. After application, solvent is removed by preliminary heating, and then further heat processing is carried out to form polyimide, then the copper foil is superimposed on the polyimide resin layer that has been converted to polyimide and laminated by thermal bonding at a temperature of about 300° C., to produce the laminate made from the stainless steel layer/polyimide layer/copper layer.

In this heating to 300° C. there is virtually no dimensional change in the stainless steel foil. However, when conventional electrodeposited copper foil is used, the electrodeposited copper foil is annealed at 300° C., and recrystallization causes progressive softening, thereby producing dimensional changes. Therefore after laminating, there is warping of the laminate, which is a problem for the dimensional accuracy of the product.

In order that warping is not produced in the laminate after laminating, it is necessary that the dimensional changes of the copper foil during heating be made as small as possible, and 0.1% or less is required.

Conventionally rolled copper alloy foil is used as the copper foil to satisfy this requirement. Rolled copper alloy foil is not annealed at a temperature of 300° C., its dimensional change during heating is small, and the change in mechanical strength is also small.

Rolled copper alloy foil is produced by rolling copper alloy that includes copper as the main component, and also includes one or more element apart from copper such as tin, zinc, iron, nickel, chromium, phosphorous, zirconium, magnesium, silicon, or the like, to produce the foil. Depending on the type of element and their combination, these rolled copper alloy foils are not annealed at about 300° C., and there is not much change in their tensile strength, 0.2% proof stress, elongation, etc.

For example, rolled copper alloy foil such as Cu-0.2 mass % Cr-0.1 mass % Zr-0.2 mass % Zn (Cu-2000 ppm Cr-1000 ppm Zr-2000 ppm Zn) is ideally suited for use as a HDD suspension member, as wells as TSA method suspensions.

High strength copper foil is also required for TAB materials, the same as for TSA method suspensions and HDD suspension materials.

In TAB products, a plurality of terminals of an IC chip are directly bonded to inner leads (flying leads) disposed in a device hole located in substantially the center of the product.

At this time the bonding is carried out using a bonding device (bonder), which instantaneously heats by passing an electric current, and applies a fixed bonding pressure. At this time, there is the problem that the inner lead which is obtained by etching the electrodeposited copper foil is pulled and extended too much by the bonding pressure.

By increasing the strength of the electrodeposited copper foil, slackness and rupture of the inner lead is inhibited. Therefore if the strength of the electrodeposited copper foil is too low, slackness of the inner lead is produced by plastic deformation, and in the extreme case there is the problem that the foil is ruptured.

On the other hand, by reducing the roughness of the copper foil surface, when forming the TAB wiring by etching, it is possible to prevent excessive thinning due to over-etching the side walls of the wiring, so it is possible to form narrow wiring by etching. The reason for this is as follows: normally HDD and TAB wiring is formed by thermal lamination of copper foil to a polyimide substrate, and then a resist is applied and etching is carried out. At this time, if the surface roughness of the copper foil is coarse, the copper foil cuts into the polyimide surface, and when the portion that was cut into is removed by etching, the side walls of the wiring are over-etched and the wire width is narrowed. In order to avoid this it is desirable that the copper foil surface should have a low roughness.

Therefore, in order to achieve narrow width inner leads, it is necessary that the electrodeposited copper foil used have low roughness and high strength.

In this case as well, it is necessary that the copper foil or copper alloy foil have high strength under normal conditions (25° C., 1 atmosphere, and hereafter also), and have high strength after heating.

For TAB applications, a two layer FPC in which the copper foil is laminated to the polyimide layer or a three layer FPC in which the copper foil is bonded to the polyimide layer with an adhesive layer are used. In the three layer FPC when bonding the copper foil to the polyimide an epoxy adhesive is used, and the bonding is carried out at a temperature of around 180° C. In the two layer FPC using a polyimide adhesive, bonding is carried out at around 300° C.

Even assuming the copper foil has high mechanical strength under normal conditions, this strength is of no benefit if it softens when bonding to the polyimide. The conventional high strength electrodeposited copper foil has high mechanical strength under normal conditions, and even when heated to about 180° C. there is almost no change in mechanical strength, however, when heated to about 300° C. annealing occurs, softening occurs rapidly as recrystallization progresses, and the mechanical strength is significantly reduced.

The following is a description of various researches that have been carried out into electrodeposited copper foil with low roughness on the surface of the copper foil that is bonded to the polyimide resin substrate (normally the rough surface of the copper foil), and with excellent mechanical strength.

For example, Patent Document 1 describes a low surface roughness electrodeposited copper foil with a uniformly low surface roughness Rz of 2.0 μm or less and with an elongation of 10.0% or more at 180° C. that is ideal as copper foil for printed wiring board applications and lithium secondary battery negative electrode current collector applications.

The above electrodeposited copper foil can be obtained with an aqueous solution of sulfuric acid-copper sulfate as the electrolyte, in the presence of polyethyleneimine or its derivative, a sulfonate salt as active organic sulfur compound, chlorine ion (chloride ion) at a concentration of 20 to 120 mg/L, and an oxyethylene surfactant with a prescribed concentration.

Also, Patent Document 2 describes an electrodeposited copper foil having a surface roughness Rz of 2.5 μm or less, whose tensile strength measured at 25° C. within 20 minutes of completion of electrodeposition is 820 MPa or higher, and whose reduction in tensile strength at 25° C. measured at 300 minutes after completion of electrodeposition is not more than 10% of the tensile strength at 25° C. measured within 20 minutes of completion of electrodeposition.

The above electrodeposited copper foil can be obtained with an aqueous solution of sulfuric acid-copper sulfate as the electrolyte, in the presence of hydroxyethyl cellulose, polyethyleneimine, a sulfonate salt as an active organic sulfur compound, acetylene glycol, and chloride ion at a concentration of 20 to 120 mg/L.

In addition, Patent Document 3 describes a controlled low profile electrodeposited copper foil having substantially no columnar grains and twin boundaries, and having a grain structure with mean grain size up to 10 μm, in which the grain structure is substantially uniform with a random grain orientation.

This electrodeposited copper foil has a maximum tensile strength at 25° C. in the range of 87,000 to 120,000 psi (600 MPa to 827 MPa), and at 180° C. has a maximum tensile strength in the range of 25,000 to 35,000 psi (172 MPa to 241 MPa).

Patent Document 4 describes a method for manufacturing electrodeposited copper foil using a sulfuric acid acid copper sulfate electrolyte to which tungsten or a tungsten compound, glue, and chloride ions at a concentration of 20 to 120 mg/L are added. As a result the hot elongation at 180° C. is 3% or more, the roughness of the rough surface is large, and it is possible to manufacture copper foil with few pinholes.

Therefore the present inventors and others carried out repeated tests on electrodeposition using an electrolyte in which tungsten or tungsten compound is added to a sulfuric acid-copper sulfate electrolyte, and glue and chloride ion to a concentration of 20 to 120 mg/L are also added, and Patent Document 4 confirmed that it is possible to manufacture copper foil in which the hot elongation at the target 180° C. is 3% or more, the roughness of the rough surface is large, and there are few pinholes. However, as a result of analyzing this copper foil, it was determined that there was no eutectoid reaction with tungsten in this electrodeposited copper foil. In other words, it was not possible to obtain electrodeposited copper alloy foil (copper-tungsten copper alloy foil) (see Comparative Example 4 which is described later).

Therefore, in the method described in Patent Document 4, it is not possible to manufacture electrodeposited copper alloy foil having low roughness on the rough surface, and high mechanical strength under normal conditions, with little reduction in mechanical strength at high temperatures when heated.

An explanation of the reasons for this is described later.

Also, Patent Document 6 describes a dispersion strengthened electrodeposited copper foil where the copper exists as fine crystal grains in which very fine grains of $SnO_2$ are dispersed.

In Patent Document 6, copper ions, sulfate ions, tin ions, and organic additives such as polyethylene glycol, and so on, are added to a sulfuric acid copper sulfate electrolyte, ultra fine particles of $SnO_2$ are generated by bubbling a gas containing oxygen into the electrolyte, and a dispersion strengthened electrodeposited copper foil is obtained using this electrolyte.

In addition, Patent Document 7 describes an electrodeposited copper foil that includes silver (Ag).

Patent Document 7 describes obtaining an electrodeposited copper foil using sulfuric acid copper sulfate electrolyte to which a silver salt having a predetermined concentration of silver ions was added. In this electrodeposited copper foil silver exists as a eutectic.

PRIOR ART DOCUMENTS

Patent Documents

Patent Document 1: Japanese Patent No. 4120806
Patent Document 2: Japanese Patent No. 4273309
Patent Document 3: Japanese Patent No. 3270637
Patent Document 4: Japanese Patent No. 3238278
Patent Document 5 Japanese Unexamined Patent Application Publication No. 2009-221592
Patent Document 6: Japanese Unexamined Patent Application Publication No. 2000-17476
Patent Document 7: Japanese Patent No. 3943214

SUMMARY OF THE INVENTION

Problems to be Solved by the Invention

However, in the case of the electrodeposited copper foil disclosed in Patent Documents 1 to 4, 6, and 7, although they each have high mechanical strength under normal conditions, when heated to a high temperature of around 300° C. the mechanical strength is significantly reduced.

In the case of the electrodeposited copper foil disclosed in Patent Documents 1 to 4 and 6, in each case sulfuric acid copper sulfate electrolyte is used, and although the type of additives are different in Patent Documents 1 to 4 and 6, in each case an organic compound is used as additive (referred to as organic additive in this document).

Normally it is considered that organic additives have the effect of inhibiting the growth of crystals, and are incorporated into the grain boundaries. In this case, the greater the quantity of organic additive incorporated into the crystal grain boundaries, the greater the increase in mechanical strength (see Patent Document 5).

In the case of the electrodeposited copper foil disclosed in Patent Documents 1 to 4 and 6 that incorporate organic additive in the crystal grain boundaries, although they each have high mechanical strength under normal conditions, when heated to a high temperature of around 300° C. the mechanical strength is significantly reduced. This is considered to be because when the organic additive that is incorporated into the crystal grain boundaries is heated to a high temperature of around 300° C. the organic additive decomposes, and as a result the mechanical strength is reduced.

On the other hand, in the electrodeposited copper foil described in Patent Document 7 which does not use organic additive, when heated to a high temperature of around 300° C., there was also significant reduction in the mechanical strength just like the electrolytic copper foil using the organic additive.

Therefore it is a task of the present invention to provide an electrodeposited copper alloy foil in which the mechanical strength is large under normal conditions, and when heated to a high temperature of around 300° C. for example, there is little thermal degradation of the mechanical properties.

In addition it is a task of the present invention to provide an electrodeposited copper alloy foil with excellent high electrical conductivity, high tensile strength, and heat resistance by incorporating a metal into the electrodeposited copper alloy foil that does not alloy with copper in conventional metallurgy.

Means to Solve the Problem

As a result of diligent investigation by the inventors, it was discovered that it is possible to obtain an electrodeposited copper alloy foil with high mechanical strength under normal conditions and having little thermal degradation of the mechanical strength when heated to a high temperature of around 300° C., by electrolytic deposition (also referred to as electrocrystallization or electrodeposition) from an electrolyte that is blended so that the concentration of chloride ion is at a predetermined low concentration, without using organic additive.

Also, the present inventors discovered that by manufacturing foil using an electrolyte obtained by mixing an aqueous solution in which is dissolved a metal salt of a metal that exists as an oxide in a solution at pH4 or lower, and an aqueous solution of copper sulfate, that has been adjusted to a predetermined low concentration of chloride ion, an electrodeposited copper alloy foil with excellent high electrical conductivity, high tensile strength, and heat resistance can be obtained, by incorporating ultra fine particles of the oxide of the metal and ultra fine particles of the metal made by partially reducing the oxide to the electrodeposited copper foil.

The present invention was completed based on this knowledge.

In other words, according to the present invention, the following means are provided.

(1) Electrodeposited copper alloy foil including a metal or its oxide that exists as an oxide in solution at pH4 or less.

(2) An electrodeposited copper alloy foil that includes a metal that exists as an oxide in a solution at pH4 or less or an oxide of the metal, having a chlorine content less than 10 ppm.

(3) An electrodeposited copper alloy foil that includes a metal that exists as an oxide in a solution at pH4 or less or an oxide of the metal, having a chlorine content less than 1 ppm.

(4) The electrodeposited copper alloy foil according to any one of (1) to (3), wherein the metal that exists as an oxide in a solution at pH4 or less or an oxide of the metal is included in a range of 10 to 2610 ppm as the metal.

(5) The electrodeposited copper alloy foil according to any one of (1) to (4), wherein the copper matrix exists as ultra fine crystal grains, and the metal oxide of the metal is dispersed throughout the copper matrix as ultra fine particles.

(6) The electrodeposited copper alloy foil according to any one of (1) to (5), wherein the metal that exists as an oxide in a solution at pH4 or less is at least one of W, Mo, Ti, and Te.

(7) The electrodeposited copper alloy foil according to any one of (1) to (6), wherein an electrical conductivity is 65% IACS or higher.

(8) The electrodeposited copper alloy foil according to any one of (1) to (7), wherein a value of tensile strength under normal conditions is 500 MPa or higher, and a value of tensile strength after heat treatment at 300° C. as a percentage of the value of tensile strength under normal conditions is 80% or higher.

(9) The electrodeposited copper alloy foil according to any one of (1) to (8), manufactured using electrolyte that includes an aqueous solution of copper sulfate, an aqueous solution of a metal salt of the metal, and chloride ion at not more than 3 mg/L.

(10) A method of manufacturing the electrodeposited copper alloy foil according to any one of (1) to (9), comprising: preparing an electrolyte by adding hydrochloric acid or a water soluble chlorine-containing compound to a mixture of an aqueous solution of copper sulfate and an aqueous solution of a metal salt of the metal, so that a chloride ion concentration is not more than 3 mg/L; and manufacturing the electrodeposited copper alloy foil by electrolytic deposition using the electrolyte.

(11) An electrodeposited copper alloy foil, comprising tungsten, the remainder being copper and unavoidable impurities.

(12) An electrodeposited copper alloy foil, comprising tungsten in the range of 10 to 2000 ppm, the remainder being copper and unavoidable impurities.

(13) A method of manufacturing an electrodeposited copper alloy foil according to (11) or (12), comprising: obtaining an electrolyte by mixing an aqueous solution of a tungsten salt to a sulfuric acid-copper sulfate electrolyte that includes not more than 3 mg/L chloride ion; and manufacturing the electrodeposited copper alloy foil by electrolytic deposition using the electrolyte.

Effects of the Invention

The electrodeposited copper alloy foil according to the present invention is an electrodeposited foil of a copper alloy such as Cu—W alloy or the like, so the mechanical strength under normal conditions is large, and, the thermal degradation of the mechanical strength after heating to a high temperature of about 300° C. is small.

Here, mechanical strength indicates the tensile strength and the 0.2% proof stress, and so on.

Also, the electrodeposited copper alloy foil according to the present invention incorporates a metal such as W, Mo, Ti, Te, and so on that metallurgically is difficult to alloy with copper in the electrodeposited copper alloy foil as ultra fine particles of oxides of the metal, so the foil has high electrical conductivity, high tensile strength, and excellent heat resistance. Here, a small portion of the metal oxide may be reduced and incorporated into the electrodeposited copper alloy foil according to the present invention as ultra fine particles of the metal. In the present invention, the ultra fine particles of the metal oxide and the ultra fine particles of the metal that exists in the electrodeposited copper alloy foil according to the present invention is referred to as the metal incorporated in the electrodeposited copper alloy foil.

Therefore, the electrodeposited copper alloy foil according to the present invention is ideal for use in various applications such as flexible printed wiring boards (FPC), lithium ion secondary battery negative electrode current collectors, and so on.

Also, the method of manufacturing the electrodeposited copper alloy foil according to the present invention is a convenient method and is ideal as the method of manufacturing the electrodeposited copper alloy foil.

Other and further features and advantages of the present invention will appear more fully from the following description.

BEST MODE FOR CARRYING OUT THE INVENTION (Configuration of the Electrodeposited Copper Alloy Foil)

The electrodeposited copper alloy foil according to the present invention includes ultra fine particles of the oxide of a metal that exists as an oxide in a solution at pH4 or less or ultra fine particles of the reduced metal. Preferably the electrodeposited copper alloy foil according to the present invention includes less than 10 ppm chlorine (chlorine free, in other words includes the case where the chlorine content is 0), and more preferably includes less than 1 ppm chlorine.

First, preferably at least one of W, Mo, Ti, and Te is used as the metal that exists as an oxide in a solution at pH4 or less, preferably a sulfuric acid solution. More preferably one of each of these metals is included.

The content of these metals in the electrodeposited copper alloy foil (the quantity incorporated) when converted to metal is preferably 80 to 2610 ppm, more preferably 100 to 2500 ppm, still more preferably 110 to 2460 ppm, and most preferably 210 to 2460 ppm. If the content is too low, the heat resistance effect is significantly reduced, for example the tensile strength after heating to 300° C. is reduced to 80% of the tensile strength under normal conditions or less. On the other hand, if the content is too high, the effect of increasing the tensile strength is not improved further, and, the electrical conductivity is reduced.

Next, the chlorine content (quantity incorporated) in the electrodeposited copper alloy foil is less than 10 ppm. If the chlorine content in the electrodeposited copper alloy foil is 10 ppm or higher, the quantity of metal oxide incorporated is greatly reduced, and the tensile strength and heat resistance improvement effects are significantly reduced.

(Crystal Grains and Dispersed Particles of the Electrodeposited Copper Alloy Foil)

In the electrodeposited copper alloy foil according to the present invention, the copper matrix exists as fine crystal grains, and the oxide of the metal is dispersed in the copper matrix as ultra fine particles.

The grain size (GS) of the fine crystal grains of the copper matrix is preferably 5 to 500 nm, and more preferably 5 to 50 nm.

On the other hand the particle diameter of the ultra fine particles of the metal oxide that includes the metal is preferably 0.5 to 20 nm, and more preferably 0.5 to 2 nm. Also, if the metal exists as ultra fine particles, preferably the particle diameter is 0.5 to 20 nm, and more preferably 0.5 to 2 nm.

(Method of Manufacturing the Electrodeposited Copper Alloy Foil)

The electrodeposited copper alloy foil according to the present invention can be manufactured by the following manufacturing method.

First, the electrolyte is prepared by adding hydrochloric acid or a water soluble compound that includes chlorine to a mixture of an aqueous solution of copper sulfate and an aqueous solution of the metal salt of the metal, so that the chloride ion concentration is 3 mg/L or less, and the electrodeposited copper alloy foil is manufactured by electrolytic deposition using the electrolyte.

1. Composition of the Electrolyte

The composition of the electrolyte is basically an aqueous solution of copper sulfate blended so that the copper ion concentration is 50 to 120 g/L, the free sulfate ion concentration is 30 to 150 g/L, and the chloride ion concentration is 3 mg/L or less. In this invention a chloride ion concentration of 3 mg/L or less is referred to as chloride ion free.

The copper ion and the free sulfate ion concentrations can be obtained by adjusting the aqueous solution of copper sulfate by adding each ion concentration. Alternatively, these ion concentrations may be adjusted by adding sulfate to the aqueous solution of copper sulfate with a predetermined copper ion concentration.

The chloride ion may be applied by adding hydrochloric acid or a water soluble chlorine-containing compound. For example sodium chloride, potassium chloride, ammonium chloride, and so on can be used as the water soluble chlorine-containing compound.

2. Add Metal Salt

The ultra fine particles of the metal oxide are dispersed in the electrolyte by adding an aqueous solution of the metal salt in which the metal salt is dissolved to the electrolyte at pH4 or less, and preferably to a sulfuric acid electrolyte, so that the ultra fine particles will be incorporated into the copper foil during electrolytic deposition.

There is no particular limitation on the metal salt provided it ionizes in solvents such as water (pH4 or higher and less than pH9), alkali (pH9 or higher), hot concentrated sulfuric acid, and so on, but at pH4 or less it becomes an oxide. Examples of these metal salts include oxoates when the metal is W or Mo, and sulfate salt when the metal is Ti. For example, tungstate salts such as sodium tungstate, potassium tungstate, ammonium tungstate, molybdate salts such as sodium molybdate, potassium molybdate, ammonium molybdate, titanium salts such as titanium sulfate, and so on, can be used.

Also, a substance that is not strictly a metal salt but that ionizes in a solvent and becomes an oxide at pH4 or less may be used. For example tellurium oxide ionizes in hot concentrated sulfuric acid, so it can be used in the present invention.

The concentration of these aqueous solutions of the metal salt is preferably 1 mg/L to 500 mg/L (as the metal), and more preferably 10 mg/L to 250 mg/L (as the metal). If this concentration is too low, it is difficult for the target metal to be sufficiently incorporated into the copper foil. On the other hand, if this concentration is too high, the target metal is excessively incorporated into the copper foil, which can result in a reduction in the electrical conductivity, saturation of the heat resistance improvement effect or conversely a reduction in the heat resistance, and a reduction in the tensile strength after heating.

In the present invention, in order to adjust the chloride concentration to the prescribed value, preferably the water used for adjusting the electrolyte or the aqueous solution of the metal salt has an extremely low chloride ion content. In this respect preferably the metal salt is dissolved in pure water to blend the aqueous solution of metal salt. Pure water is preferably water that does not include metal ion or chloride ion. Specifically, preferably the chloride ion concentration of the water is 3 mg/L or less, and more preferably the chloride ion concentration of the water is 1 mg/L or less.

3. Manufacturing Conditions

The conditions during electrolytic deposition are as follows.
Current density from 30 to 100 A/dm$^2$
Temperature from 30 to 70° C.

With the above conditions, it is possible to manufacture electrodeposited copper alloy foil with a foil thickness of, for example, 12 μm.

(Mechanism)

The reason for adding the aqueous solution of the metal salt to the electrolyte is so that the metal to be incorporated in the copper foil exists in the aqueous solution as an ion, and this is added to the electrolyte. By adding the metal in this form, the metal ion forms ultra fine particles of metal oxide when it is converted into the oxide in the electrolyte at pH4 or less. In contrast, if the metal salt is directly added to the electrolyte, ultra fine particles of the metal oxide are not formed, so it is not possible to obtain the tensile strength and heat resistance improvement effect.

The reason for keeping the concentration of chloride ion in the electrolyte to 3 mg/L or lower is to prevent obstruction of adsorption of the ultra fine particles of metal oxide due to preferential adsorption of chlorine into the copper foil surface during electrolytic deposition of the ultra fine particles of the metal oxide. If the concentration of chloride ion is higher than 3 mg/L, the incorporation of metal into the electrodeposited copper alloy foil is reduced, and the tensile strength and heat resistance improvement effects are dramatically reduced.

(Dislocation Obstruction Effect)

The metal material including the copper foil is re-crystallized when heated to above the re-crystallization temperature, so the crystal grains become coarse, and as a result the strength is reduced. Here the origin of the re-crystallization process is the movement of dislocations (unstable state of lattice defects, and so on). In the electrodeposited copper alloy foil according to the present invention, movement of dislocations around the ultra fine particles of the metal oxide is obstructed by dispersing the ultra fine particles of metal oxide in the copper matrix phase. Therefore, the foil must be heated to a higher temperature to soften it, so a higher heat resistance can be obtained.

In this document this fact is referred to as "high dislocation obstruction effect".

(Foil Thickness of the Electrodeposited Copper Alloy Foil)

There is no particular limitation on the foil thickness of the electrodeposited copper alloy foil according to the present invention, and it may be adjusted in accordance with the required foil thickness for the application. For example, a thickness of 3 to 20 μm may be used for flexible printed wiring boards (FPC). On the other hand, a thickness of 5 to 30 μm may be used for lithium ion secondary battery negative electrode current collectors.

(Properties of the Electrodeposited Copper Alloy Foil)

The electrodeposited copper alloy foil according to the present invention preferably has an electrical conductivity of 55% IACS or higher, more preferably 65% IACS or higher, and most preferably 70% IACS or higher. There is no particular limitation on the upper limit of the electrical conductivity, and in some cases 100% IACS is exceeded.

The electrodeposited copper alloy foil according to the present invention preferably has a value of tensile strength under normal conditions of 500 MPa or higher, and more preferably 600 MPa or higher. There is no particular limitation on the upper limit of the tensile strength under normal conditions, but normally it is 1100 MPa or less.

The electrodeposited copper alloy foil according to the present invention preferably has a value of tensile strength after heat treatment at 300° C. that is 50% or higher than the value of tensile strength under normal conditions, more preferably 80% or higher, and most preferably 90% or higher. There is no particular limitation on the upper limit of this percentage, and in some cases it may exceed 100% (in other words, the tensile strength is increased after heat treatment).

An embodiment of the electrodeposited copper alloy foil according to the present invention is electrodeposited copper alloy foil that includes tungsten, and the remainder is copper and unavoidable impurities.

Here, tungsten is included means that the tungsten exists as ultra fine particles of tungsten oxide dispersed in the copper matrix. However, in some cases during the process of incorporation of tungsten into the copper matrix, a very small portion of the tungsten oxide is reduced to metallic tungsten and incorporated. In this invention, electric field copper alloy foil includes tungsten means that ultra fine particles of this metallic tungsten may exist dispersed in the copper matrix, in addition to the ultra fine particles of tungsten oxide that exists dispersed in the copper matrix.

In this document, ultra fine particles of tungsten oxide together with ultra fine particles of metallic tungsten are collectively referred to as the tungsten included in the electrodeposited copper alloy foil.

Preferably the quantity of tungsten included in the electrodeposited copper alloy foil is in the range of 10 to 2000 ppm, and more preferably is in the range of 280 to 2000 ppm. Here, the quantity of tungsten included in the electrodeposited copper alloy foil is the tungsten component that includes ultra fine particles of both tungsten oxide and metallic tungsten converted to metallic tungsten. If the tungsten content is too small the effect of its addition is very small. On the other hand, if the quantity of tungsten added is too large the effect of its addition saturates, and even though the cost is increased no effect of improvement in the properties is seen.

In other words, in electrodeposited copper alloy foil with a tungsten content of less than 10 ppm, the mechanical strength after heating at 300° C. for one hour (hereafter abbreviated to "300° C.×1H") is significantly reduced to about the same as if tungsten was not included.

As the quantity of tungsten added is increased, the reduction in strength after heating to 300° C.×1H becomes smaller, but when the content reaches a certain level the effect saturates. The upper limit to the effect of addition is about 2000 ppm.

The unit "ppm" used to indicate the quantity of this component means "mg/kg". Also, 0.0001 mass %=1 ppm.

The electrodeposited copper alloy foil according to the present invention can be obtained by electrolysis of copper sulfate type electrolyte at pH4 or less that includes the copper ions and tungsten oxide generated from the tungsten salt at pH4 or less.

The tungsten salt included in the electrolyte should dissolve in sulfuric acid-copper sulfate electrolyte, and can be sodium tungstate, ammonium tungstate, potassium tungstate, and so on.

In the low chloride ion concentration electrolyte, it is considered that tungstate ions from the tungsten salt are changed in the electrolyte at pH4 or less to tungsten oxide, and the tungsten oxide ($WO_3$, $W_2O_5$, $WO_2$, and so on) is incorporated into the electrodeposited copper alloy foil according to the present invention by electrolytic deposition using this electrolyte as it is or as the reduced metallic tungsten. Here, these tungsten oxides ($WO_3$, $W_2O_5$, $WO_2$, and so on) or the metallic tungsten ultra fine particles exist dispersed in the copper matrix.

In other words, in the low chloride ion concentration sulfuric acid-copper sulfate electrolyte, the electrodeposited copper alloy foil according to the present invention is formed by electrolytic deposition from electrolyte that includes tungsten oxide. In the sulfuric acid-copper sulfate electrolyte that includes tungsten oxide, it is considered that tungsten oxide is formed as ultra fine particles via tungsten oxide ions ($WO_4^{2-}$ or $WO_5^{2-}$, and so on) from the tungsten salt.

When the electrodeposited copper alloy foil is formed by the electrolytic deposition of copper in low chloride ion concentration sulfuric acid-copper sulfate electrolyte that includes tungsten oxide, ultra fine particles of both tungsten oxide ($WO_3$, $W_2O_5$, $WO_2$, and so on) and metallic tungsten are incorporated into the crystal grain boundaries, and inhibit the growth of the crystal nuclei, so the crystal grains are refined (low profile), and electrodeposited copper alloy foil with high mechanical strength under normal conditions is obtained.

It is considered that the ultra fine particles of tungsten oxide ($WO_3$, $W_2O_5$, $WO_2$, and so on) or metallic tungsten that exists at the crystal grain boundaries of the electrodeposited copper alloy foil are not bonded to or absorbed by the bulk copper, but the tungsten oxide ($WO_3$, $W_2O_5$, $WO_2$, and so on) or the metallic tungsten remain as ultra fine particles at the crystal grain boundaries.

Even when electrodeposited copper alloy foil that includes tungsten oxide or tungsten is heated to a high temperature of about 300° C., the ultra fine particles of tungsten oxide ($WO_3$, $W_2O_5$, $WO_2$, and so on) and the metallic tungsten remain at the crystal grain boundaries, which has the action of preventing re-crystallization of the fine crystals of copper due to the heat, and preventing the crystal grains from coarsening.

Therefore, the electrodeposited copper alloy foil according to the present invention has low surface roughness, at normal conditions the mechanical strength is large, and after being heated to about 300° C. the reduction in the mechanical strength is small, which are excellent characteristics that cannot be found in conventional electrodeposited copper foil manufactured using sulfuric acid-copper sulfate electrolyte that includes organic additive.

Conventionally electrodeposited copper foil is manufactured by electrolytic deposition of the copper from a sulfuric acid-copper sulfate electrolyte in a rotating titanium drum, and this is peeled off and continuously wound. The surface of the copper foil that contacts the electrolyte is referred to as the rough surface, and the surface in contact with the titanium drum is referred to as the gloss surface.

The electrodeposited copper alloy foil according to the present invention has a surface roughness of the rough surface of Rz≤2.5 μm, which is low roughness. The gloss surface is a replica of the titanium drum, and is about Rz=0.5 to 3.0 μm.

Here Rz indicates Rz measured based on JISB0601-1994 (ten-point average roughness).

As described previously, the organic additive added to the conventional sulfuric acid-copper sulfate electrolyte is considered to form compounds with the metal element and chlorine in the electrolyte. In this case the metal element is copper. Therefore a copper-organic additive-chlorine compound is formed in the sulfuric acid-copper sulfate electrolyte. When electrodeposited copper foil is formed by electrolytic deposition of copper from the electrolyte, the copper-organic additive-chlorine compound is adsorbed into the crystal grain boundary, so the growth of the crystal nuclei is inhibited, the crystal grains are refined, and an electrodeposited copper foil is formed with high mechanical strength under normal conditions.

However, the substance at the crystal grain boundary of the copper foil is a copper-organic additive-chlorine compound, so the copper is bound to or adsorbed into the bulk copper crystal, so the substance at the crystal grain boundary is only organic additive and chlorine, so it is considered that when the organic additive and the chlorine are exposed to a high temperature at around 300° C. they decompose, and as a result the mechanical strength is reduced.

The reason the tensile strength is significantly reduced when heated to a high temperature at around 300° C. is considered to be because the compound at the crystal grain boundary is an organic compound (organic additive) that can easily decompose when heated to around 300° C., so the mechanical strength is reduced.

With the technologies disclosed in Patent Documents 1 to 4 and 6, electrodeposited copper foil is manufactured each using different organic compounds, but in each case the electrodeposited copper foil is manufactured from sulfuric acid-copper sulfate electrolyte that includes organic additive and chlorine, and the organic compound component is adsorbed to the crystal grain boundary of the electrodeposited copper foil. Therefore, when the electrodeposited copper foil is exposed to high temperature at around 300° C., there is a significant reduction in the mechanical strength, and this is considered to be because the compound that is adsorbed into the crystal grain boundary in each case is an organic compound that easily decomposes at a high temperature of around 300° C.

In contrast the electrodeposited copper alloy foil according to the present invention is formed by electrolytic deposition from an electrolyte that includes tungsten oxide in a low chloride ion concentration sulfuric acid-copper sulfate electrolyte.

As stated above, it is considered that the tungsten component is formed via tungsten oxide ions ($WO_4^{2-}$ or $WO_5^{2-}$, and so on) in the sulfuric acid-copper sulfate electrolyte as ultra fine particles of tungsten oxide ($WO_3$, $W_2O_5$, $WO_2$, and so on) and the metallic tungsten. When copper alloy foil is formed by electrolytic deposition of copper from this electrolyte, the ultra fine particles of tungsten oxide ($WO_3$, $W_2O_5$, $WO_2$, and so on) and the metallic tungsten are absorbed as they are into the crystal grain boundary. As a result, growth of the crystal nuclei is inhibited, the crystal grains are refined, and electrodeposited copper alloy foil with high mechanical strength under normal conditions is formed.

Therefore, in the electrodeposited copper alloy foil according to the present invention, the ultra fine particles of the tungsten oxide ($WO_3$, $W_2O_5$, $WO_2$, and so on) and the metallic tungsten exist at the crystal grain boundary, so unlike the case with copper-organic additive-chlorine compound, the tungsten is not bonded to or adsorbed into the bulk copper crystal, and it is considered that the ultra fine particles of tungsten oxide ($WO_3$, $W_2O_5$, $WO_2$, and so on) and the metallic tungsten remain as they are at the crystal grain boundary.

Therefore, even when exposed to a high temperature of about 300° C., the ultra fine particles of the tungsten oxide ($WO_3$, $W_2O_5$, $WO_2$, and so on) and the metallic tungsten remain at the crystal grain boundary, and the fine crystals of copper are re-crystallized due to the heat, which has the action of preventing coarsening the crystals.

Therefore, the roughness of the rough surface is low, the mechanical strength is high under normal conditions, and the reduction in mechanical strength after heating to a high temperature of about 300° C. is small, which are excellent characteristics that cannot be found in conventional electrodeposited copper foil manufactured using sulfuric acid-copper sulfate electrolyte that includes organic additive.

The electrodeposited copper alloy foil according to the present invention is ideal for use in flexible printed wiring boards (FPC), lithium ion secondary battery negative electrode current collectors, and so on.

As stated previously, in the case of FPC, low roughness and a certain level of strength or higher after casting the polyimide or laminating by heating are necessary.

Also, in lithium ion secondary battery negative electrode current collectors, if polyimide is used as the binder, heat treatment is carried out on the negative electrode to harden the polyimide. If the copper foil softens and its strength is reduced too much after this heat treatment, stresses from the expansion and contraction of the active substance is applied to the copper foil during charging and discharging, and in some cases the foil can be deformed. If the reduction in strength is even greater the copper foil could rupture. Therefore, it is necessary that copper foil for use as a negative electrode current collector has a certain level of strength or higher after the heat treatment.

In this way, for both flexible printed wiring boards (FPC) and lithium ion secondary battery negative electrode current collectors, heating to a temperature of 300° C. is carried out for thermal curing of the polyimide. Therefore, after the copper foil is heated to at temperature of 300° C.×1H, a certain level of strength or higher is necessary.

In the electrodeposited copper alloy foil according to the present invention, the following is a guide to the level of each item of the mechanical properties achieved. The surface roughness (M surface roughness) is Ra≤0.5 μm and Rz≤2.5 μm. Under normal conditions the tensile strength TS 500 MPa, 0.2% proof stress YS≥300 MPa, and elongation E1≥2%. After heating at 180° C., the tensile strength is TS≥10 MPa, the 0.2% proof stress YS≥200 MPa, and the elongation E1≥1.5%. After heating to 300° C.×1H the tensile strength TS≥280 MPa, the 0.2% proof stress YS≥150 MPa, and the elongation E≥2.5%. Also, after heating to 300° C.×1H the tensile strength as a percentage of the tensile strength under normal conditions is 60% or higher.

EXAMPLES

The present invention will be described in more detail based on examples given below, but the invention is not meant to be limited by these.

Practical Example 1

The following sulfuric acid-copper sulfate electrolyte bath was used as the basic bath composition.
Cu=50 to 150 g/L
$H_2SO_4$=20 to 200 g/L The following quantity of sodium tungstate as additive A1 was dissolved to form an aqueous solution, and this aqueous solution was added to the electrolyte with the basic bath composition to obtain electrolyte 1.
Sodium tungstate=1 mg/L to 500 mg/L (as tungsten)

In Table 1 which is described later, Examples 1-1 to 1-7 are shown as Practical Example 1 for the following seven levels of the quantity of sodium tungstate added as additive A.
Example 1-1 Sodium tungstate=260 mg/L (as tungsten)
Example 1-2 Sodium tungstate=150 mg/L (as tungsten)
Example 1-3 Sodium tungstate=100 mg/L (as tungsten)
Example 1-4 Sodium tungstate=50 mg/L (as tungsten)
Example 1-5 Sodium tungstate=30 mg/L (as tungsten)
Example 1-6 Sodium tungstate=20 mg/L (as tungsten)
Example 1-7 Sodium tungstate=10 mg/L (as tungsten)

In each case the chloride ion concentration was 0 mg/L (no chloride ion added).

Electrolytic deposition was carried out under the following conditions using each of the seven levels of Electrolyte 1, and in each case electrodeposited copper alloy foil that includes tungsten was manufactured to a thickness of 12 μm.
Current density=from 30 to 100 A/dm²
Temperature=30 to 70° C.

For each of the electrodeposited copper alloy foils obtained, the surface roughness of the rough surface (M surface), the tensile strength (TS) under normal conditions, the 0.2% proof stress (YS), the elongation (El), the tensile strength, 0.2% proof stress, and elongation after heating at 180° C.×1H, the tensile strength, 0.2% proof stress, and elongation after heating at 300° C.×1H, and the W content of the copper alloy foil were measured. The results are shown in Table 1.

Here, the surface roughness of the rough surface (M surface) was measured based on JISB0601-1994, and Ra (arithmetic mean roughness) and Rz (10 point average roughness) are shown.

Also, the tensile strength, the 0.2% proof stress, and the elongation (failure elongation) were measured in accordance with JISZ2241-1880.

The W content of the copper alloy foil was obtained by dissolving a predetermined quantity of electrodeposited copper alloy foil in acid, and analyzing the W in the solvent by the ICP emission spectrochemical analysis method, to obtain the W content of the electrodeposited copper alloy foil. The results are shown in Table 1 as the W content (ppm).

A guide to the pass level for each of the mechanical property measurement items in the present example is as follows. The surface roughness (M surface roughness) is Ra≤0.5 μm and Rz≤2.5 μm. Under normal conditions the tensile strength TS≥500 MPa, 0.2% proof stress YS≥300 MPa, and elongation E≥2%. After heating to 180° C. the tensile strength TS≥310 MPa, 0.2% proof stress YS≥200 MPa, and elongation E1≥1.5%. After heating to 300° C.×1H the tensile strength TS≥280 MPa, 0.2% proof stress YS≥150 MPa, and elongation E1≥2.5%. Also, after heating to 300° C.×1H the ratio of the tensile strength relative to the tensile strength under normal conditions is 60% or higher.

Practical Example 2

The following sulfuric acid-copper sulfate electrolyte bath was used as the basic bath composition.
Cu=80 to 120 g/L
$H_2SO_4$=80 to 120 g/L
The following quantity of ammonium tungstate as additive A2 was dissolved to form an aqueous solution, and this aqueous solution was added to the electrolyte with the basic bath composition to obtain electrolyte 2.
Practical Example 2 Ammonium Tungstate=150 mg/L (as tungsten)
The chloride ion concentration was 0 mg/L (no chloride ion added).
Electrolytic deposition was carried out under the following conditions using Electrolyte 2, and electrodeposited copper alloy foil that includes tungsten was manufactured to a thickness of 12 μm.
Current density=from 50 to 100 A/dm$^2$
Temperature=50 to 70° C.
For the electrodeposited copper alloy foil obtained, the surface roughness of the rough surface (M surface), the tensile strength under normal conditions, the 0.2% proof stress, the elongation, the tensile strength, 0.2% proof stress, and elongation after heating at 180° C.×1H, the tensile strength, 0.2% proof stress, and elongation after heating at 300° C.×1H, and the W content of the copper alloy foil were measured. The results are shown in Table 1.

Practical Example 3

The following sulfuric acid-copper sulfate electrolyte bath was used as the basic bath composition.
Cu=80 to 120 g/L
$H_2SO_4$=80 to 120 g/L
The following quantity of potassium tungstate as additive A3 was dissolved in the basic bath to form an aqueous solution, and this aqueous solution was added to the electrolyte with the basic bath composition to obtain electrolyte 2.
Practical Example 3 Potassium tungstate=150 mg/L (as tungsten)
The chloride ion concentration was 0 mg/L (no chloride ion added).
Electrolytic deposition was carried out under the following conditions using Electrolyte 3, and electrodeposited copper alloy foil that includes tungsten was manufactured to a thickness of 12 μm.
Current density=from 50 to 100 A/dm$^2$
Temperature=50 to 70° C.
For the electrodeposited copper alloy foil obtained, the surface roughness of the rough surface (M surface), the tensile strength under normal conditions, the 0.2% proof stress, the elongation, the tensile strength, 0.2% proof stress, and elongation after heating at 180° C.×1H, the tensile strength, 0.2% proof stress, and elongation after heating at 300° C.×1H, and the W content of the copper alloy foil were measured. The results are shown in Table 1.

Comparative Example 1

Electrodeposited copper alloy foil was manufactured in the same way as Practical Example 1 with thickness 12 μm, except that the W content was changed to a low concentration with sodium tungstate=3 mg/L (as tungsten), so the W content was 5 ppm.
For the electrodeposited copper alloy foil obtained, the surface roughness of the rough surface (M surface), the tensile strength under normal conditions, the 0.2% proof stress, the elongation, the tensile strength, 0.2% proof stress, and elongation after heating at 180° C.×1H, the tensile strength, 0.2% proof stress, and elongation after heating at 300° C.×1H, and the W content of the copper alloy foil were measured. The results are shown in Table 1.

Comparative Example 2

The basic bath composition as sulfuric acid-copper sulfate electrolyte was as follows, and no additive was added.
Cu=80 to 120 g/L
$H_2SO_4$=80 to 120 g/L
Electrolytic deposition was carried out under the following conditions using the electrolyte, and electrodeposited copper foil was manufactured to a thickness of 12 μm.
Current density=from 50 to 100 A/dm$^2$
Temperature=50 to 70° C.
For the electrodeposited copper alloy foil obtained, the surface roughness of the rough surface (M surface), the tensile strength under normal conditions, the 0.2% proof stress, the elongation, the tensile strength, 0.2% proof stress, and elongation after heating at 180° C.×1H, the tensile strength, 0.2% proof stress, and elongation after heating at 300° C.×1H, and the W content of the copper alloy foil were measured. The results are shown in Table 1.

Comparative Example 3

The following sulfuric acid-copper sulfate electrolyte bath was used as the basic bath composition.
Cu=80 to 120 g/L
$H_2SO_4$=80 to 120 g/L
The electrolyte was obtained by adding sodium tungstate as additive A1 and hydrochloric acid as additive B to the basic bath in the following quantities.
Sodium tungstate=10 mg/L to 100 mg/L (as tungsten)
Chloride ion (Cl$^-$)=20 mg/L to 100 mg/L
Electrolytic deposition was carried out under the following conditions using the electrolyte, and electrodeposited copper foil was manufactured to a thickness of 12 μm.
Current density=from 50 to 100 A/dm$^2$
Temperature=50 to 70° C.
For the electrodeposited copper alloy foil obtained, the surface roughness of the rough surface (M surface), the tensile strength under normal conditions, the 0.2% proof stress, the elongation, the tensile strength, 0.2% proof stress, and elongation after heating at 180° C.×1H, the tensile strength, 0.2% proof stress, and elongation after heating at 300° C.×1H, and the W content of the copper alloy foil were measured. The results are shown in Table 1.

Comparative Example 4

The following sulfuric acid-copper sulfate electrolyte bath was used as the basic bath composition.
Cu=80 to 120 g/L
$H_2SO_4$=80 to 120 g/L
Sodium tungstate as additive A1, hydrochloric acid as additive B, and glue as additive C were added to the basic bath in the following quantities.

Sodium tungstate=10 mg/L to 100 mg/L (as tungsten)
Chloride ion (Cl⁻)=20 mg/L to 100 mg/L
Glue=2 to 10 mg/L
Electrolytic deposition was carried out under the following conditions using the electrolyte, and electrodeposited copper foil was manufactured to a thickness of 12 μm.
Current density=from 50 to 100 A/dm$^2$
Temperature=50 to 70° C.

For the electrodeposited copper alloy foil obtained, the surface roughness of the rough surface (M surface), the tensile strength under normal conditions, the 0.2% proof stress, the elongation, the tensile strength, 0.2% proof stress, and elongation after heating at 180° C.×1H, the tensile strength, 0.2% proof stress, and elongation after heating at 300° C.×1H, and the W content of the copper alloy foil were measured. The results are shown in Table 1.

TABLE 1

Table 1 Mechanical properties of copper foil

| | M surface | | Normal conditions | | | After heating to 180° C. × 1 H | | |
|---|---|---|---|---|---|---|---|---|
| | surface roughness | | Tensile | 0.2% proof | | Tensile | 0.2% proof | |
| | Ra (μm) | Rz (μm) | strength (MPa) | stress (MPa) | Elongation (%) | strength (MPa) | stress (MPa) | Elongation (%) |
| Example 1-1 | 0.37 | 2.00 | 843 | 533 | 2.9 | 790 | 541 | 3.0 |
| Example 1-2 | 0.40 | 2.20 | 835 | 506 | 3.8 | 804 | 585 | 2.2 |
| Example 1-3 | 0.42 | 2.15 | 812 | 508 | 4.1 | 780 | 501 | 3.4 |
| Example 1-4 | 0.41 | 2.35 | 691 | 460 | 4.8 | 667 | 501 | 2.8 |
| Example 1-5 | 0.36 | 2.10 | 650 | 433 | 3.7 | 503 | 546 | 1.6 |
| Example 1-6 | 0.32 | 2.05 | 584 | 389 | 5.5 | 526 | 364 | 2.7 |
| Example 1-7 | 0.39 | 2.30 | 510 | 345 | 4.2 | 315 | 209 | 4.4 |
| Working Example 2 | 0.38 | 2.15 | 795 | 490 | 4.0 | 760 | 492 | 3.3 |
| Working Example 3 | 0.36 | 2.13 | 800 | 497 | 3.6 | 754 | 480 | 3.2 |
| Comparative Example 1 | 0.30 | 1.90 | 515 | 352 | 6.0 | 250 | 154 | 17.0 |
| Comparative Example 2 | 0.28 | 1.82 | 520 | 370 | 7.5 | 246 | 150 | 17.9 |
| Comparative Example 3 | 0.43 | 2.60 | 432 | 291 | 6.1 | 242 | 129 | 14.0 |
| Comparative Example 4 | 0.60 | 5.00 | 340 | 210 | 5.5 | 310 | 198 | 7.5 |

| | After heating to 300° C. × 1 H | | | Tensile strength after heating to 300° C. × 1 H as a percentage of tensile strength under normal conditions (%) | W content (ppm) |
|---|---|---|---|---|---|
| | Tensile strength (MPa) | 0.2% proof stress (MPa) | Elongation (%) | | |
| Example 1-1 | 797 | 576 | 3.3 | 94.5 | 1,900 |
| Example 1-2 | 844 | 582 | 4.1 | 101.2 | 1,230 |
| Example 1-3 | 790 | 569 | 3.1 | 97.3 | 1,050 |
| Example 1-4 | 716 | 500 | 3.8 | 103.6 | 672 |
| Example 1-5 | 631 | 458 | 3.9 | 97.1 | 280 |
| Example 1-6 | 353 | 229 | 4.7 | 60.4 | 117 |
| Example 1-7 | 301 | 188 | 9.0 | 59.0 | 15 |
| Working Example 2 | 775 | 523 | 3.3 | 97.5 | 980 |
| Working Example 3 | 783 | 537 | 3.9 | 97.9 | 1,010 |
| Comparative Example 1 | 220 | 113 | 18.0 | 42.7 | 5 |
| Comparative Example 2 | 212 | 110 | 19.2 | 40.8 | Less than the lower limit of detection |
| Comparative Example 3 | 222 | 100 | 15.2 | 51.4 | Less than the lower limit of detection |
| Comparative Example 4 | 259 | 124 | 13.7 | 76.2 | Less than the lower limit of detection |

The surface roughness of the electrodeposited copper alloy foil containing tungsten according to Examples 1-1 to 1-7 and Practical Example 2 and Practical Example 3 were sufficiently small, also the mechanical strength under normal conditions was large, the reduction in mechanical strength after heating to 180° C.×1H and after heating to 300° C.×1H was small, for example the value of tensile strength was maintained at 300 MPa or higher.

When the tungsten content was 500 ppm or less, a trend of reducing mechanical strength proportional to the reduction in the tungsten content was seen, but as can be seen from Example 1-7 when the tungsten content is 10 ppm or higher, a tensile strength is seen of 300 MPa or higher, for example.

Electrodeposited copper alloy foil according to Comparative Example 1 which included tungsten 5 ppm and electrodeposited copper foil according to Comparative Example 2 which included no tungsten had virtually the same mechanical properties. When the tungsten content is too low the effect of addition of tungsten is small, and as a result the mechanical properties were inferior compared with the Practical Examples.

The electrodeposited copper foil according to Comparative Example 3 for which tungsten and chloride ion at a concentration exceeding 3 mg/L was added to the electrolyte had unsatisfactory mechanical strength under normal conditions, and after heating to 300° C.×1H the mechanical strength was reduced significantly. Also the result of measuring the W content in this copper foil was below the lower limit for detection (1 ppm (=0.0001 mass %)).

When chloride ion is included in the electrolyte it can be seen that the precipitation of tungsten is inhibited, and although electrodeposited copper foil is formed, it is not possible to form electrodeposited copper alloy foil made from Cu—W copper gold.

Comparative Example 4 was prepared based on Patent Document 4 (Japanese Patent No. 3238278), which was prepared with a composition obtained by adding glue to the electrolyte of Comparative Example 3.

The roughness of the rough surface was coarse, the mechanical strength under normal conditions was small, and after heating at 300° C.×1H the mechanical strength of the electrodeposited copper foil was significantly reduced. Also the result of measuring the W content in this copper foil was below the lower limit for detection.

When chloride ion is included in the electrolyte in excess of 3 mg/L, it is difficult for tungsten or the like to form an alloy with copper and electrolytic deposition of the metal is inhibited, and for example, electrodeposited copper foil with coarse rough surface roughness on the rough surface is formed by the addition effect of organic additives such as glue, however, it was confirmed that electrodeposited copper alloy foil is not formed.

As stated previously, during the investigations by the inventors to arrive at the present invention, when tungsten oxide that has transformed from a tungsten salt exists in the sulfuric acid-copper sulfate electrolyte, and further there is a high content of chloride ions in excess of 3 mg/L, it was confirmed that there is no eutectoid reaction between tungsten in the electrodeposited copper, and as a result it was not possible to obtain electrodeposited copper alloy foil. The present invention is based on this knowledge. Practical Examples 11-21, Comparative Examples 11-13, Reference Example For Practical Examples 11 to 21 and Comparative Example 11, the following basic bath composition was used as the sulfuric acid-copper sulfate electrolyte.

Cu=80 to 120 g/L
$H_2SO_4$=80 to 120 g/L

To this basic bath, the various metal salt compounds (sources of various metals) and sodium chloride (source of chloride ion) were added as additives as shown in Table 2, and adjusted to the metal salt concentration and chloride ion content as shown in Table 2, to obtain the electrolyte.

Electrolytic deposition was carried out under the following conditions using each of the electrolytes, and in each case electrodeposited copper alloy foil was manufactured to a thickness of 12 μm.

Current density=50 to 100 A/dm$^2$
Temperature=50 to 70° C.

Comparative Example 12 was prepared based on Patent Document 6 (Japanese Unexamined Patent Application Publication 2000-17476). Electrolyte including $CuSO_4.5H_2O$, $H_2SO_4$, and $SnSO_4$ was bubbled with air, and an electrolyte was produced with $CuSO_4.5H_2O$=250 g/dm$^3$ (g/L), $H_2SO_4$=50 g/L, $SnO_2$ ultra fine particles=3 g/L, $SnSO_4$=10 g/L, and polyethylene glycol as polyether=0.001 to 0.1 g/L. Electrolytic deposition was carried out using this electrolyte under the conditions of current density=10 A/dm$^2$ and bath temperature=50° C., and electrodeposited copper alloy foil was produced with a thickness of 12 μm.

Comparative Example 13 was prepared based on Patent Document 7 (Japanese Patent Number 3943214). An electrolyte obtained by adding 50 ppm of silver ion to a sulfuric acid copper sulfate solution with a copper ion concentration of 70 to 120 g/L and sulfate ion concentration of 50 to 120 g/L was used. Electrolytic deposition was carried out using this electrolyte under the conditions of current density=120 A/dm$^2$ and electrolyte temperature=57° C., and electrodeposited copper foil was produced with a thickness of 12 μm.

As the Reference Example, commercial Cu-0.015 to 0.03Z rolled copper alloy foil (commercial name: HCL (registered trademark) –02Z, manufactured by Hitachi Cable Ltd.) 12 μm thick was used.

For each of the practical examples and comparative examples of electrodeposited copper (alloy) foil obtained and the Reference Example rolled copper alloy foil, the tensile strength under normal conditions (tensile strength, TS), the tensile strength after heating to 300° C.×1H, their ratio, the electrical conductivity (EC), the chlorine content, and the metal content were measured as follows.

The tensile strength was measured based on JISZ2241-1880. Values of tensile strength of the copper foil under normal conditions of 500 MPa or more were judged to be good, and less than 500 MPa were judged to be bad. Also, as an additional desirable condition, if the value of tensile strength after heat treatment of the copper foil at 300° C. for 1 hour (300° C.×1H) as a percentage of the value of tensile strength under normal conditions is 80% or higher it was judged to be good, and if less than 80% it was judged to be bad.

The electrical conductivity was measured based on JIS-K6271 by the 4 terminal method (current voltage method). The copper foil was judged to be excellent if the electrical conductivity was 65% IACS or higher, good if 50% IACS or higher, and bad if less than 50% IACS.

The metal content, such as W and so on, and the Cl content in the copper foil was obtained by dissolving a predetermined quantity of electrodeposited copper (alloy) foil in acid, and the metal content such as W and so on was measured by the ICP emission spectrochemical analysis method. Also, the chlorine content of the solution obtained was measured by the silver chloride titration method (limit of detection: 10 ppm).

The results are shown in Table 2.

TABLE 2

|  | Metal type | Metal salt compound type | Metal salt concentration in the electrolyte *1 (mg/L) | Chloride ion concentration in the electrolyte (mg/L) | Tensile strength (MPa) Normal conditions | Tensile strength (MPa) 300° C. × 1 H after heating | Tensile strength after heating to 300° C. × 1 H as a percentage of tensile strength under normal conditions (%) | Electrical conductivity (% IACS) | Chlorine content (ppm) | Metal content *2 (ppm) |
|---|---|---|---|---|---|---|---|---|---|---|
| Working Example 11 | W | Sodium tungstate (IV) dihydrate | 30 | 0 | 650 | 631 | 97.1 | 84.2 | <10 | 280 |
| Working Example 12 | W | Sodium tungstate (IV) dihydrate | 100 | 0 | 812 | 791 | 97.4 | 78.7 | <10 | 1050 |
| Working Example 13 | W | Sodium tungstate (IV) dihydrate | 250 | 0 | 843 | 797 | 94.5 | 65.2 | <10 | 1700 |
| Working Example 14 | W | Sodium tungstate (IV) dihydrate | 380 | 0 | 840 | 720 | 85.7 | 65.0 | <10 | 2460 |
| Working Example 15 | W | Sodium tungstate (IV) dihydrate | 500 | 0 | 841 | 610 | 72.5 | 58.6 | <10 | 2610 |
| Working Example 16 | W | Sodium tungstate (IV) dihydrate | 10 | 0 | 584 | 303 | 51.9 | 90.6 | <10 | 80 |
| Working Example 17 | W | Sodium tungstate (IV) dihydrate | 100 | 3 | 710 | 688 | 96.9 | 82.6 | <10 | 360 |
| Working Example 18 | Mo | Sodium molybdate (IV) dihydrate | 20 | 0 | 556 | 552 | 99.3 | 75.2 | <10 | 210 |
| Working Example 19 | Ti | Titanium sulfate (IV) | 2 | 0 | 712 | 602 | 84.6 | 68.4 | <10 | 110 |
| Working Example 20 | Te | Tellurium oxide (IV) | 10 | 0 | 592 | 483 | 81.6 | 86.2 | <10 | 150 |
| Working Example 21 | Mo | Sodium molybdate (IV) dihydrate | 10 | 0 | 504 | 368 | 73.0 | 85.3 | <10 | 80 |
| Comparative Example 11 | W | Sodium tungstate (IV) heptahydrate | 100 | 7 | 423 | 304 | 71.9 | 91.2 | 15 | 40 |
| Comparative Example 12 | Sn | SnO$_2$ ultra fine particles | 3000 | 0 | 631 | 576 | 91.3 | 49.9 | <10 | 2980 |
| Comparative Example 13 | Ag | Ag ion | 50 | 0 | 501 | 298 |  |  |  |  |
| Reference Example | Zr | — | — | — | 554 | 494 |  |  |  |  |

TABLE 2-continued

| | | | | |
|---|---|---|---|---|
| Comparative Example 13 | 59.5 | 96.2 | <10 | 520 |
| Reference Example | 89.2 | 89.7 | — | 200 |

Note:
Detection limit of chloride ion content: 10 ppm (0.001 mass %)
*1 The concentration of metal salt in each electrolyte is the quantity converted into the respective metals, based on the quantity of each metal salt added
*2 The quantity of metal in the foil is the quantity of ultra fine particles of each metal oxide of each metal and, if it exists, the quantity of ultra fine particles of each metal, each converted to the quantity of metal.

Practical Examples 11 to 14 had tungsten (W) oxide ultra fine particles as the metal oxide, Practical Example 18 had molybdenum (Mo) oxide ultra fine particles as the metal oxide, Practical Example 19 had titanium (Ti) oxide ultra fine particles as the metal oxide, and Practical Example 20 had tellurium (Te) oxide ultra fine particles as the metal oxide, each incorporated into the electrodeposited copper alloy foil, and the quantity incorporated was in the range of 100 to 2500 ppm converted into the respective metals. Therefore the foils had high tensile strength under normal conditions of 500 MPa or higher, and the percentage reduction in tensile strength after heating to 300° C. was small. The electrical conductivity was also high at 65% or more.

Practical Example 16 had tungsten (W) oxide ultra fine particles, and Practical Example 21 had molybdenum (Mo) oxide ultra fine particles, but the quantity incorporated was small at less than 100 ppm in each case. Therefore, the tensile strength under normal conditions was sufficiently high, but after heating to 300° C.×1H the tensile strength was greatly reduced.

In Practical Example 15 the quantity of tungsten (W) oxide ultra fine particles incorporated exceeded 2500 ppm. Therefore the effect of increasing the tensile strength and the heat resistance was seen, but the electrical conductivity was lower than 65%.

In Practical Example 17 the chloride ion content of the electrolyte was 3 ppm. The results were comparable with Practical Examples 11 to 14.

Practical Example 13 was a test example with a different metal (W) content from Example 1-1. In both cases the metal (W) content was high, so it is considered that the effect of the metal (W) had saturated, and the test results in the two test examples were the same.

Also, although not indicated on Table 2, the chlorine content of the electrodeposited copper foil of Practical Examples 11 to 16 was measured by Secondary Ion Mass Spectrometry (SIMS) analysis. The SIMS analysis measurement conditions were, primary ions: Cs+(5 kV, 100 nA), secondary (detection) ions: copper (Cu) $^{63}$Cu—, chlorine (Cl) $^{35}$Cl—, and sputter area: 200 μm×400 μm. The surface of the electrodeposited copper foil was affected by contamination and an oxide film, so up to 2 μm in the depth direction from the surface was removed by sputtering, then the measurements were started, and analysis was carried out to a depth of 4 μm. The result of calculating the strength ratio from the average value of the strength of each measured element and the average value of the strength of the copper compared with a standard sample showed that the chlorine content of the electrodeposited copper foil of each practical example was less than 1 ppm. It is inferred that keeping the chlorine content low contributes to increasing the quantity of tungsten and improving the heat resistance.

In Comparative Example 11 the chlorine content was higher than 10 ppm. Therefore the quantity of tungsten (W) oxide ultra fine particles incorporated was small, and the value of the tensile strength was significantly lower compared with Practical Examples 11 to 14.

Comparative Example 12 was a test example prepared based on Patent Document 6 (Japanese Unexamined Patent Application Publication 2000-17476). Cu—Sn is well known as a rolled alloy. In the electric field copper foil of Comparative Example 12, no advantage in terms of the various mechanical properties and the manufacturing cost were seen compared with Cu—Sn rolled alloy. Also, tin sulfate ($SnSO_4$), which is not an oxide in a sulfuric acid electrolyte, is forced to convert to an oxide by bubbling oxygen to create SnO2 ultra fine particles, so not only does this entail manufacturing cost, but also the particle diameter (in excess of 20 nm) of the oxide incorporated into the copper foil generated in the electrolyte was significantly larger than the particles in the present invention, so the electrical conductivity was extremely low.

Comparative Example 13 was a test example prepared based on Patent Document 7 (Japanese Patent Number 3943214). In the electric field copper foil of Comparative Example 13, Ag is incorporated as metallic Ag by solid solution in Cu. Therefore compared with the practical examples of the present invention that are precipitation strengthened by incorporating the ultra fine particles of the metal oxide, the tensile strength after heating to 300° C.×1H as a percentage of the tensile strength under normal conditions (%) was inferior. This indicates that the smaller the particle diameter of the particles dispersed in the copper matrix the higher the dislocation obstruction effect (in other words, heat resistance), and in Comparative Example 13 the dislocation obstruction effect was low, so the effect of preventing reduction in the tensile strength due to heating was very low.

The Reference Example was Cu-0.02Zr rolled copper alloy foil. The electrodeposited copper alloy foil according to the present invention has mechanical properties and electrical conductivity that are equal or better compared with rolled copper alloy foil.

INDUSTRIAL APPLICABILITY

The electrodeposited copper alloy foil according to the present invention is ideal for use as a printed wiring board material for which high mechanical strength is required after heating, for example as a HDD suspension material, or a constituent material in the field of TAB materials.

Additionally, the electrodeposited copper alloy foil according to the present invention is ideal for use as a constituent material in fields that require high mechanical strength and electrical conductivity after heating to a high temperature, apart from printed wiring board materials.

In addition, the electrodeposited copper alloy foil according to the present invention is ideal for use as a battery member, such as lithium ion secondary battery negative electrode current collectors, and so on.

Having described our invention as related to the present embodiments, it is our intention that the invention not be limited by any of the details of the description, unless otherwise specified, but rather be construed broadly within its spirit and scope as set out in the accompanying claims.

The present application claims priority based on Japanese Patent Application No. 2011-238485 which was filed in Japan on Oct. 31, 2011, which is entirely herein incorporated by reference.

The invention claimed is:

1. An electrodeposited copper alloy foil comprising a metal that exists as an oxide in a solution at pH4 or less or an oxide of the metal, wherein said metal that exists as an oxide in a solution at pH4 or less or said oxide of the metal is contained inside a copper matrix of said electrodeposited copper alloy.

2. The electrodeposited copper alloy foil according to claim 1, wherein the metal that exists as an oxide in a solution at pH4 or less or an oxide of the metal is included in a range of 10 to 2610 ppm as the metal.

3. The electrodeposited copper alloy foil according to claim 1, wherein the copper matrix exists as ultra fine crystal grains, and the metal oxide of the metal is dispersed throughout the copper matrix as ultra fine particles.

4. The electrodeposited copper alloy foil according to claim 1 wherein the metal that exists as an oxide in a solution at pH4 or less is at least one of W, Mo, Ti, and Te.

5. The electrodeposited copper alloy foil according to claim 1, wherein an electrical conductivity is 65% IACS or higher.

6. The electrodeposited copper alloy foil according to claim 1, wherein a value of tensile strength under normal conditions is 500 MPa or higher, and a value of tensile strength after heat treatment at 300° C. as a percentage of the value of tensile strength under normal conditions is 80% or higher.

7. The electrodeposited copper alloy foil according to claim 1, manufactured using electrolyte that includes an aqueous solution of copper sulfate, an aqueous solution of a metal salt of the above-mentioned metal, and chloride ion at not more than 3 mg/L.

8. A method of manufacturing the electrodeposited copper alloy foil according to claim 1, comprising: preparing an electrolyte by adding hydrochloric acid or a water soluble chlorine-containing compound to a mixture of an aqueous solution of copper sulfate and an aqueous solution of a metal salt of the above-mentioned metal, so that a chloride ion concentration is not more than 3 mg/L; and manufacturing the electrodeposited copper alloy foil by electrolytic deposition using the electrolyte.

9. An electrodeposited copper alloy foil comprising a metal that exists as an oxide in a solution at pH4 or less or an oxide of the metal, having a chlorine content less than 10 ppm, wherein said metal that exists as an oxide in a solution at pH4 or less or said oxide of the metal is contained inside a copper matrix of said electrodeposited copper alloy.

10. The electrodeposited copper alloy foil according to claim 9, wherein the metal that exists as an oxide in a solution at pH4 or less or an oxide of the metal is included in a range of 10 to 2610 ppm as the metal.

11. The electrodeposited copper alloy foil according to claim 9, wherein the copper matrix exists as ultra fine crystal grains, and the metal oxide of the metal is dispersed throughout the copper matrix as ultra fine particles.

12. The electrodeposited copper alloy foil according to claim 9 wherein the metal that exists as an oxide in a solution at pH4 or less is at least one of W, Mo, Ti, and Te.

13. The electrodeposited copper alloy foil according to claim 9, wherein an electrical conductivity is 65% IACS or higher.

14. The electrodeposited copper alloy foil according to claim 9, wherein a value of tensile strength under normal conditions is 500 MPa or higher, and a value of tensile strength after heat treatment at 300° C. as a percentage of the value of tensile strength under normal conditions is 80% or higher.

15. The electrodeposited copper alloy foil according to claim 9, manufactured using electrolyte that includes an aqueous solution of copper sulfate, an aqueous solution of a metal salt of the above-mentioned metal, and chloride ion at not more than 3 mg/L.

16. A method of manufacturing the electrodeposited copper alloy foil according to claim 9, comprising: preparing an electrolyte by adding hydrochloric acid or a water soluble chlorine-containing compound to a mixture of an aqueous solution of copper sulfate and an aqueous solution of a metal salt of the above-mentioned metal, so that a chloride ion concentration is not more than 3 mg/L; and manufacturing the electrodeposited copper alloy foil by electrolytic deposition using the electrolyte.

17. An electrodeposited copper alloy foil comprising a metal that exists as an oxide in a solution at pH4 or less or an oxide of the metal, having a chlorine content less than 1 ppm, wherein said metal that exists as an oxide in a solution at pH4 or less or said oxide of the metal is contained inside a copper matrix of said electrodeposited copper alloy.

18. The electrodeposited copper alloy foil according to claim 17, wherein the metal that exists as an oxide in a solution at pH4 or less or an oxide of the metal is included in a range of 10 to 2610 ppm as the metal.

19. The electrodeposited copper alloy foil according to claim 17, wherein the copper matrix exists as ultra fine crystal grains, and the metal oxide of the metal is dispersed throughout the copper matrix as ultra fine particles.

20. The electrodeposited copper alloy foil according to claim 17, wherein the metal that exists as an oxide in a solution at pH4 or less is at least one of W, Mo, Ti, and Te.

21. The electrodeposited copper alloy foil according to claim 17, wherein an electrical conductivity is 65% IACS or higher.

22. The electrodeposited copper alloy foil according to claim 17, wherein a value of tensile strength under normal conditions is 500 MPa or higher, and a value of tensile strength after heat treatment at 300° C. as a percentage of the value of tensile strength under normal conditions is 80% or higher.

23. The electrodeposited copper alloy foil according to claim 17, manufactured using electrolyte that includes an aqueous solution of copper sulfate, an aqueous solution of a metal salt of the above-mentioned metal, and chloride ion at not more than 3 mg/L.

24. A method of manufacturing the electrodeposited copper alloy foil according to claim 17, comprising: preparing an electrolyte by adding hydrochloric acid or a water soluble chlorine-containing compound to a mixture of an aqueous solution of copper sulfate and an aqueous solution of a metal salt of the above-mentioned metal, so that a chloride ion concentration is not more than 3 mg/L; and manufacturing the electrodeposited copper alloy foil by electrolytic deposition using the electrolyte.

25. An electrodeposited copper alloy foil comprising tungsten, the remainder being copper and unavoidable impurities, wherein said tungsten is contained inside a copper matrix of said electrodeposited copper alloy foil.

26. A method of manufacturing an electrodeposited copper alloy foil according to claim 25, comprising: obtaining an electrolyte by mixing an aqueous solution of a tungsten salt to a sulfuric acid-copper sulfate electrolyte that includes not more than 3 mg/L chloride ion; and manufacturing the electrodeposited copper alloy foil by electrolytic deposition using the electrolyte.

27. An electrodeposited copper alloy foil comprising tungsten in a range of 10 to 2000 ppm, the remainder being copper and unavoidable impurities, wherein said tungsten is contained inside a copper matrix of said electrodeposited copper alloy foil.

28. A method of manufacturing an electrodeposited copper alloy foil according to claim 27, comprising: obtaining an electrolyte by mixing an aqueous solution of a tungsten salt to a sulfuric acid-copper sulfate electrolyte that includes not more than 3 mg/L chloride ion; and manufacturing the electrodeposited copper alloy foil by electrolytic deposition using the electrolyte.

* * * * *